US012719008B2

(12) United States Patent
Enyama et al.

(10) Patent No.: US 12,719,008 B2
(45) Date of Patent: Aug. 25, 2026

(54) ELECTRON BEAM APPLICATION APPARATUS AND INSPECTION METHOD

(71) Applicant: Hitachi High-Tech Corporation, Tokyo (JP)

(72) Inventors: Momoyo Enyama, Tokyo (JP); Akira Ikegami, Tokyo (JP); Takeshi Morimoto, Tokyo (JP); Shun Kizawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 464 days.

(21) Appl. No.: 17/878,113

(22) Filed: Aug. 1, 2022

(65) Prior Publication Data

US 2023/0071801 A1 Mar. 9, 2023

(30) Foreign Application Priority Data

Sep. 6, 2021 (JP) ................................ 2021-144394

(51) Int. Cl.
*H01J 37/10* (2006.01)
*G01N 23/227* (2018.01)
(Continued)

(52) U.S. Cl.
CPC .............. *H01J 37/10* (2013.01); *H01J 37/21* (2013.01); *H01J 37/226* (2013.01); *H01J 37/285* (2013.01); *H01J 2237/2855* (2013.01)

(58) Field of Classification Search
CPC .......... H01J 37/10; H01J 37/21; H01J 37/226; H01J 37/285; H01J 2237/2855; G01N 23/227
See application file for complete search history.

(56) References Cited

U.S. PATENT DOCUMENTS 10,146,041 B1 * 12/2018 Putman .................... G02B 7/38
2003/0128870 A1 * 7/2003 Pease ................. G03F 7/70591 313/539

(Continued)

FOREIGN PATENT DOCUMENTS

CN 112309808 A * 2/2021 ............. H01J 37/20
JP 2009-528668 A 8/2009
WO 2007/100978 A2 9/2007

OTHER PUBLICATIONS

CN 112309808 A English Translation from Espacenent (Year: 2021).*
Ma, et. al. Translation (Year: 2021).*

*Primary Examiner* — David E Smith
*Assistant Examiner* — Laura Eloise Tandy
(74) *Attorney, Agent, or Firm* — MATTINGLY & MALUR, PC

(57) ABSTRACT

An electron beam application apparatus includes: an optical system configured to irradiate a sample with excitation light; an electron optical system configured to project, onto a camera, a photoelectron image formed by photoelectrons emitted from the sample irradiated with the excitation light; and a control unit. The optical system includes a light source configured to generate the excitation light and a pattern forming unit. The excitation light forms an optical pattern on a surface of the sample when the pattern forming unit is turned on, and the excitation light is emitted to the sample without forming the optical pattern on the surface of the sample when the pattern forming unit is turned off. The control unit adjusts the electron optical system based on feature data of a bright and dark pattern formed by the optical pattern in the photoelectron image obtained by turning on the pattern forming unit.

9 Claims, 8 Drawing Sheets

(51) Int. Cl.

| | |
|---|---|
| ***H01J 37/21*** | (2006.01) |
| ***H01J 37/22*** | (2006.01) |
| ***H01J 37/285*** | (2006.01) |

(56) References Cited

U.S. PATENT DOCUMENTS

| | | | | |
|---|---|---|---|---|
| 2010/0091362 A1* | 4/2010 | Isozaki | ................ | G02B 21/367 250/311 |
| 2020/0152415 A1* | 5/2020 | Ogata | ..................... | H01J 37/10 |

* cited by examiner

ELECTRON BEAM APPLICATION APPARATUS AND INSPECTION METHOD

CROSS-REFERENCE TO RELATED APPLICATION

This application claims priority to Japanese Patent Application No. 2021-144394 filed on Sep. 6, 2021, the entire contents of which are incorporated by reference herein.

BACKGROUND OF THE INVENTION

1. Field of the Invention

The present invention relates to an electron beam application apparatus and an inspection method using the same.

2. Description of the Related Art

A photoelectron emission microscope (PEEM) is an apparatus that forms an image using photoelectrons generated by irradiating a surface of a sample with ultraviolet light or X-rays (excitation light), and can obtain a photoelectron image having contrast caused by a surface structure of the sample.

JP-T-2009-528668 discloses an example of a structure of a cathode lens microscope (PEEM is an example thereof).

In an electron optical system of PEEM, a photoelectron image is projected onto a camera by an imaging lens system. When a sample to be observed has a different height, it is necessary to change an intensity (focal length) of an objective lens in order to adjust focus of the photoelectron image. Accordingly, a size of the photoelectron image formed on an object plane of the imaging lens system is changed. As a result, the size of the photoelectron image projected onto the camera (an image plane of the imaging lens system) is changed.

In order to eliminate the change in the size of the photoelectron image due to focus adjustment, for example, the focus adjustment is performed by acquiring a photoelectron image of a pattern in which a size of a standard sample or a sample to be observed is known. Accordingly, a magnification of the obtained photoelectron image may be grasped, and the magnification of the photoelectron image may be adjusted to a predetermined magnification. However, in this method, it is necessary to move an observation field of view in order to adjust the magnification, and a long time is required. In addition, in order to calculate the magnification of the photoelectron image with high accuracy, it is necessary to obtain a photoelectron image having high contrast.

SUMMARY OF THE INVENTION

An electron beam application apparatus according to an embodiment of the invention includes: an optical system configured to irradiate a sample with excitation light; an electron optical system configured to project, onto a camera, a photoelectron image formed by photoelectrons emitted from the sample irradiated with the excitation light; and a control unit. The optical system includes a light source configured to generate the excitation light and a pattern forming unit. The excitation light forms an optical pattern on a surface of the sample when the pattern forming unit is turned on, and the excitation light is emitted to the sample without forming the optical pattern on the surface of the sample when the pattern forming unit is turned off. The control unit adjusts the electron optical system based on feature data of a bright and dark pattern formed by the optical pattern in the photoelectron image obtained by turning on the pattern forming unit.

An electron optical system of a projection electron beam application apparatus can be adjusted at a high speed and with high accuracy. Other problems and novel characteristics will be apparent from a description of the description and the accompanying drawings.

DESCRIPTION OF THE PREFERRED EMBODIMENTS

Figure 1:
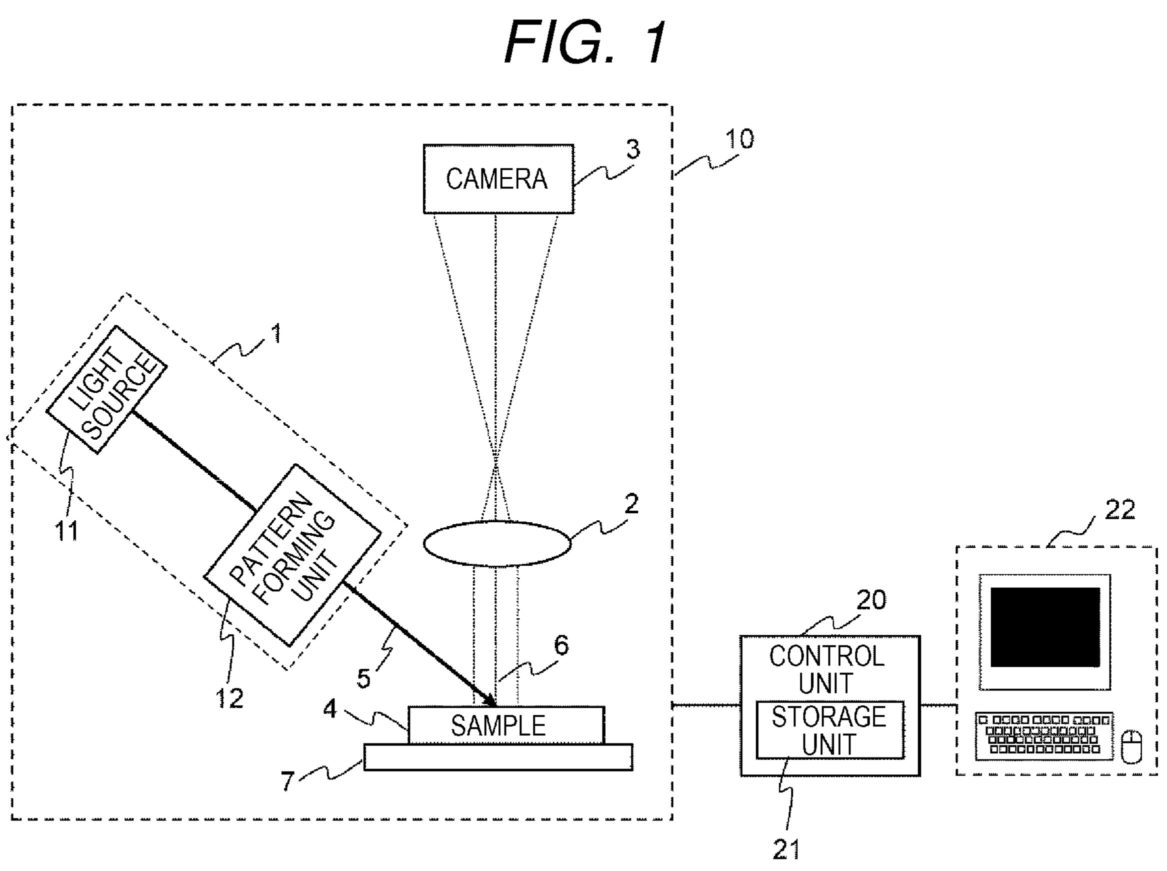
FIG. 1 is a configuration example of an electron beam application apparatus.

FIG. 1 shows a configuration example of an electron beam application apparatus according to the present embodiment. FIG. 1 shows an example of PEEM that obtains an image (photoelectron image) formed of photoelectrons generated by irradiating a surface of a sample with excitation light such as laser light or X-rays. A main configuration of an apparatus main body 10 includes a stage 7 on which a sample 4 is placed, an optical system 1 that irradiates the sample 4 with excitation light 5, a camera 3 that captures a photoelectron image, and an electron optical system 2 that projects the photoelectron image onto the camera 3. The optical system 1 includes a light source 11 that generates the excitation light 5 and a pattern forming unit 12. The pattern forming unit 12 irradiates the sample 4 with the excitation light 5 from the light source 11 as pattern light to form an optical pattern on a surface of the sample 4. As will be described later in detail, the sample 4 is irradiated with the pattern light by turning on the pattern forming unit 12 and light (hereinafter, referred to as uniform light) that does not form an optical pattern on the sample surface by turning off the pattern forming unit 12 from the optical system 1. In addition, the optical system 1 may include an optical element such as a lens or a mirror in order to irradiate the sample 4 with the excitation light 5. The photoelectron image formed by photoelectrons 6 generated by irradiating the sample 4 with the excitation light 5 is projected onto the camera 3 by the electron optical system 2. In FIG. 1, the electron optical system 2 is represented by an electron lens for display, and includes one or more stages of electron lenses and other electron optical elements. The camera 3 may detect the photoelectrons and capture an image of the photoelectrons by itself, or may include a scintillator. The electrons are temporarily converted into light by the scintillator, and the camera 3 may detect the converted light and capture an image of the converted light.

The apparatus main body 10 is connected to a control unit 20. The control unit 20 receives an instruction issued from a user input from a graphic user interface (GUI) device 22, controls the apparatus main body 10, and performs image processing on the photoelectron image captured by the camera 3. The control unit 20 includes a storage unit 21, and control parameters of the apparatus main body 10 and the photoelectron image are stored in the storage unit 21.

Figure 2A:
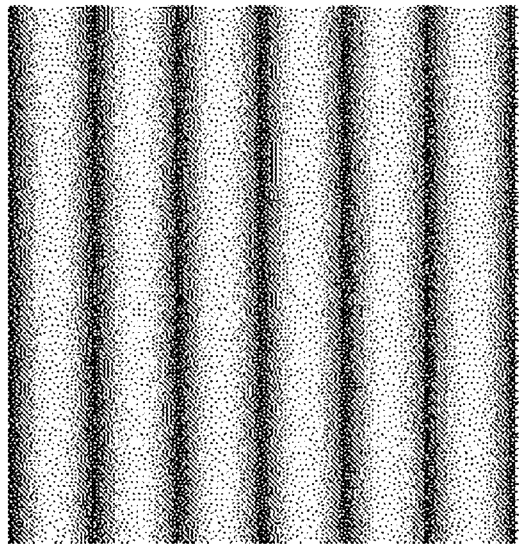
FIG. 2A is a schematic diagram of an interference fringe.
Figure 2B:
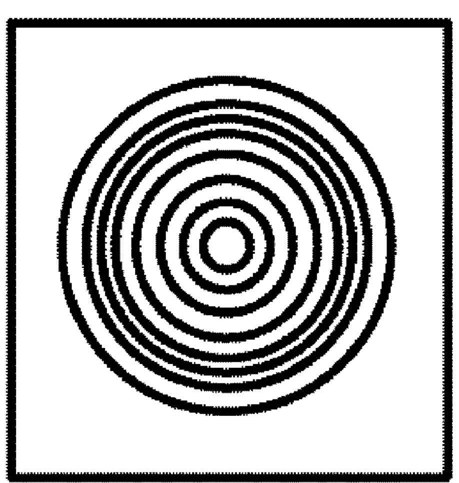
FIG. 2B is a schematic diagram of an interference fringe.

Hereinafter, the pattern light with which the sample 4 is irradiated by the pattern forming unit 12 will be described. A first example of the optical pattern formed by the pattern light is an interference fringe generated by branching the excitation light from the light source 11 into a plurality of pieces of excitation light by the pattern forming unit 12 and causing the plurality of pieces of excitation light to interfere with each other. FIG. 2A is a schematic diagram of an interference fringe obtained when the pattern forming unit 12 forms a one-dimensional optical path difference, and an intensity of the excitation light 5 changes so as to form stripe patterns on the sample surface. FIG. 2B is a schematic diagram of an interference fringe obtained when the pattern forming unit 12 forms a two-dimensional optical path difference, and the intensity of the excitation light 5 changes so as to form concentric circle patterns on the sample surface.

Figure 3A:
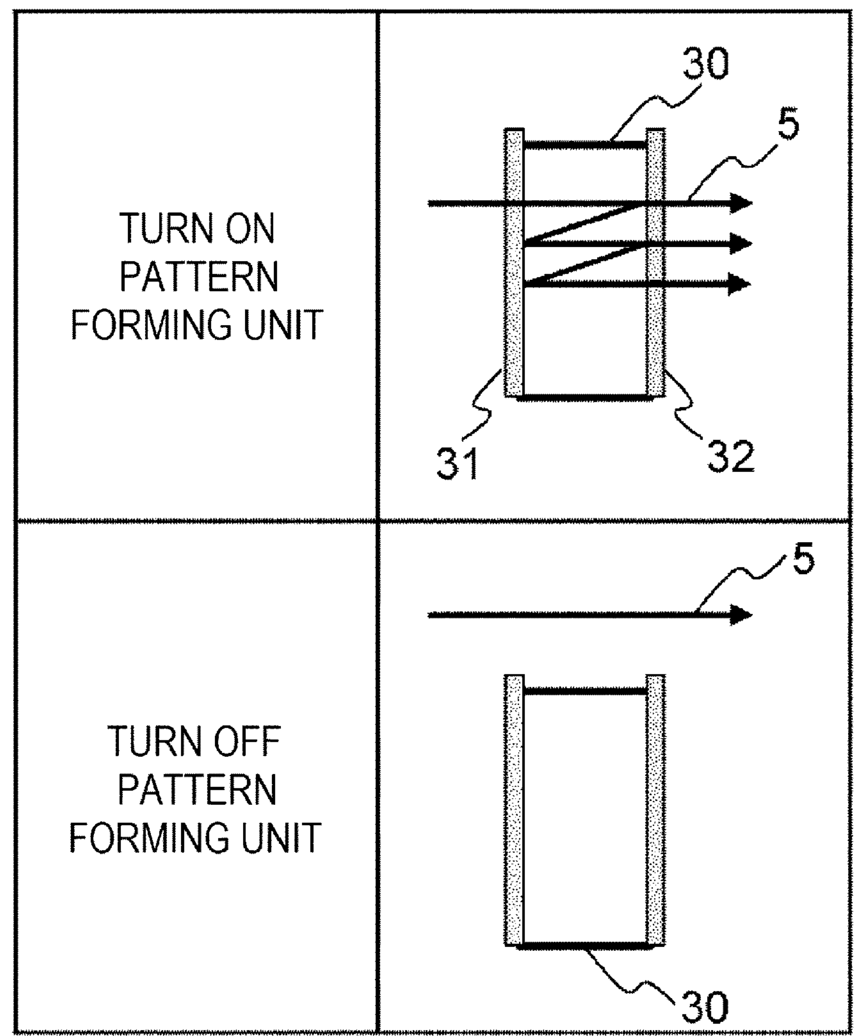
FIG. 3A is a configuration example of a pattern forming unit.
Figure 3B:
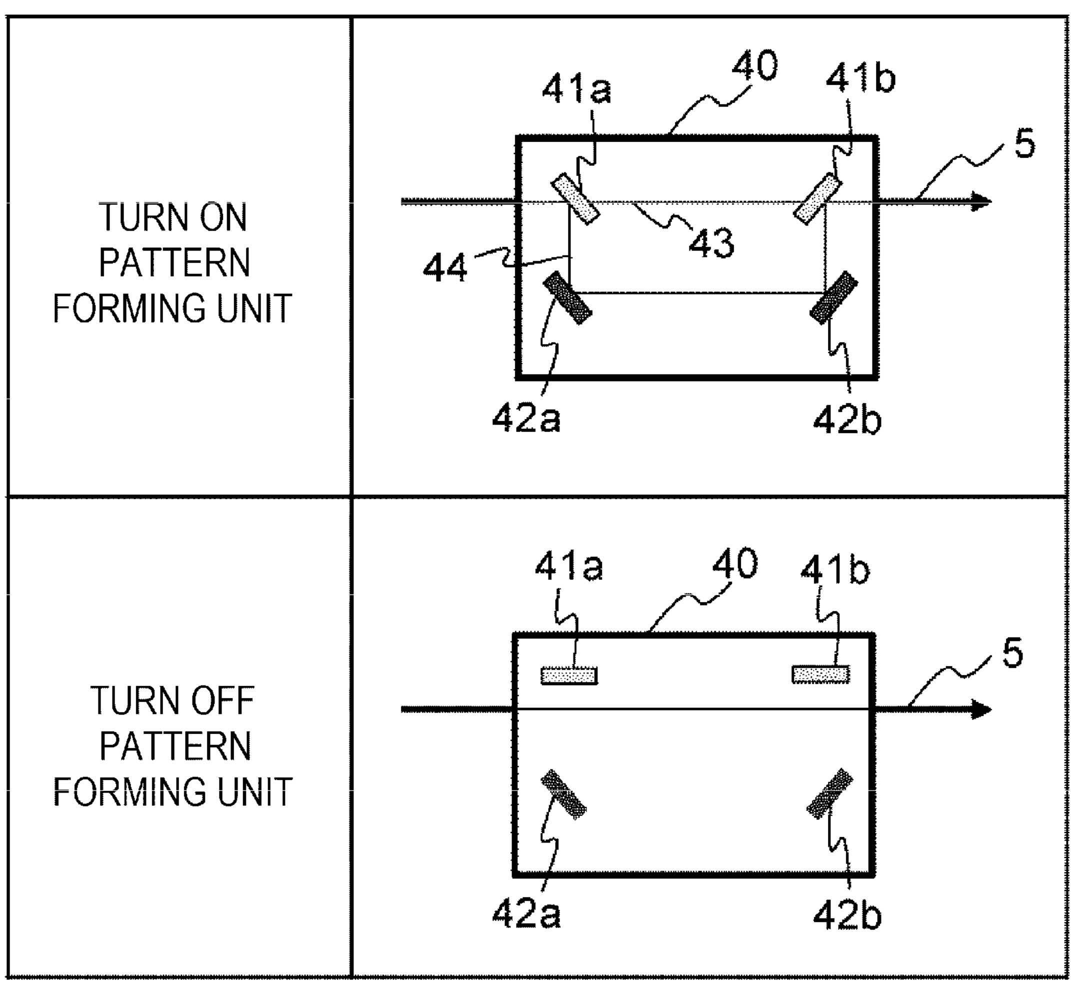
FIG. 3B is a configuration example of the pattern forming unit.
Figure 3C:
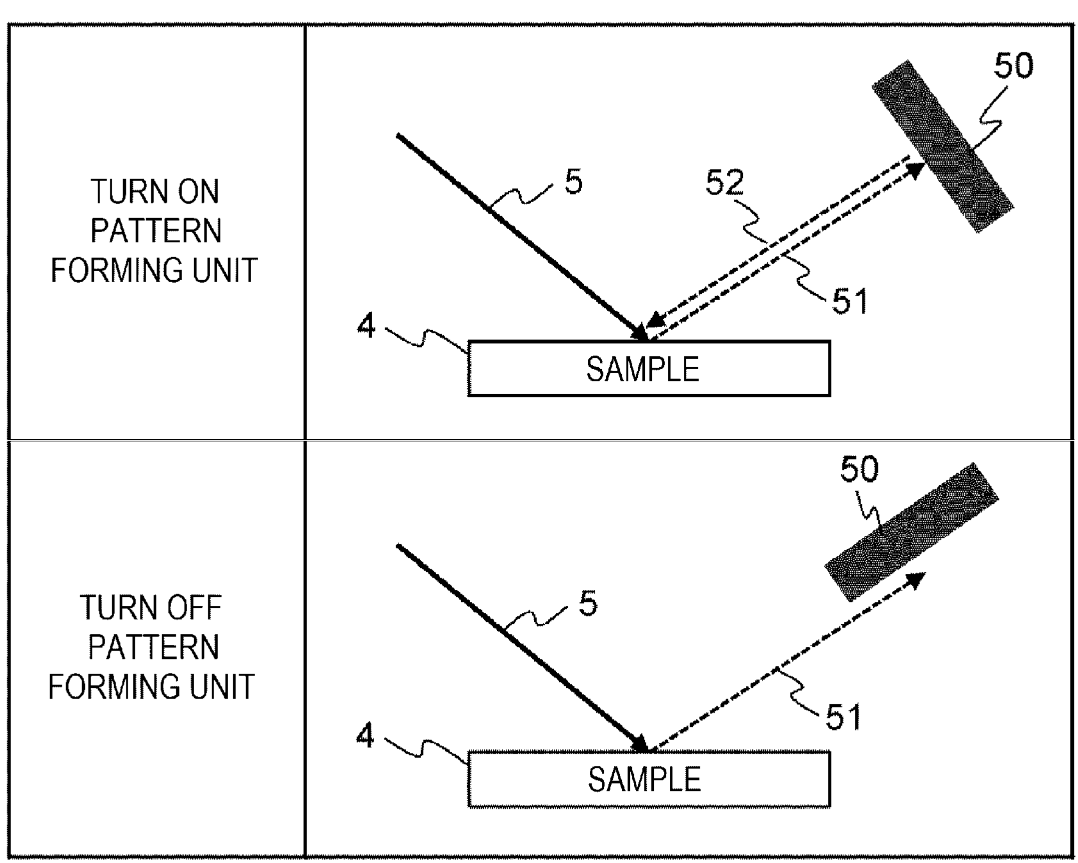
FIG. 3C is a configuration example of the pattern forming unit.

FIGS. 3A to 3C show configuration examples of the pattern forming unit 12 that forms interference fringes on the sample surface. FIG. 3A is an example in which an optical element 30 having an optical plane is used for the pattern forming unit 12. When the pattern forming unit 12 is turned on, the optical element 30 is inserted into an optical path of the excitation light. The excitation light is multiply reflected between an incident surface 31 and an emission surface 32 of the optical element 30, so that the excitation light is branched into light having an optical path difference and an interference fringe is generated. When the pattern forming unit 12 is turned off, the optical element 30 is moved outside the optical path of the excitation light. In the drawing, the reflection between the incident surface 31 and the emission surface 32 is displayed with an angle, but this is to clearly show a state of multiple reflections. When the optical plane of the optical element 30 is disposed perpendicular to the optical path, reflected light from the emission surface 32 is reflected in a direction perpendicular to the emission surface 32, and therefore positional displacement does not occur between light transmitted through the optical element 30 as shown in FIG. 3A and light reflected in the optical element 30.

FIG. 3B is an example in which an optical assembly 40 that generates an optical path difference by optical path branching is used. The optical assembly 40 branches incident light into a plurality of optical paths, merges the light again, and emits the light. In the example of FIG. 3B, the optical assembly 40 includes movable half mirrors 41*a* and 41*b* and fixed mirrors 42*a* and 42*b*. When the pattern forming unit 12 is turned on, the half mirrors 41*a* and 41*b* are inserted into the optical path of the excitation light. The half mirrors 41*a* and 41*b* are inserted into the optical path of the excitation light, so that the excitation light is branched by the half mirror 41*a* into light transmitted through the half mirror 41*a* and light reflected by the half mirror 41*a*. Transmitted light 43 passes through the half mirror 41*b* and is emitted from the optical assembly 40. Meanwhile, reflected light 44 is reflected by the mirror 42*a*, the mirror 42*b*, and the half mirror 41*b*, merges with the transmitted light 43, and is emitted from the optical assembly 40. The excitation light having the optical path difference interferes with each other, so that an interference fringe is generated. When the pattern forming unit 12 is turned off, the half mirrors 41*a* and 41*b* are moved outside the optical path of the excitation light.

FIG. 3C shows an example in which a movable mirror 50 is used. When the pattern forming unit 12 is turned on, the movable mirror 50 is disposed so as to be perpendicular to an optical path of reflected light 51 of the excitation light 5 reflected by the sample 4, and reflected light 52 of the movable mirror 50 and the excitation light 5 interfere with each other to generate an interference fringe. When the pattern forming unit 12 is turned off, the movable mirror 50 is moved outside the optical path of the reflected light 51.

Figure 4A:
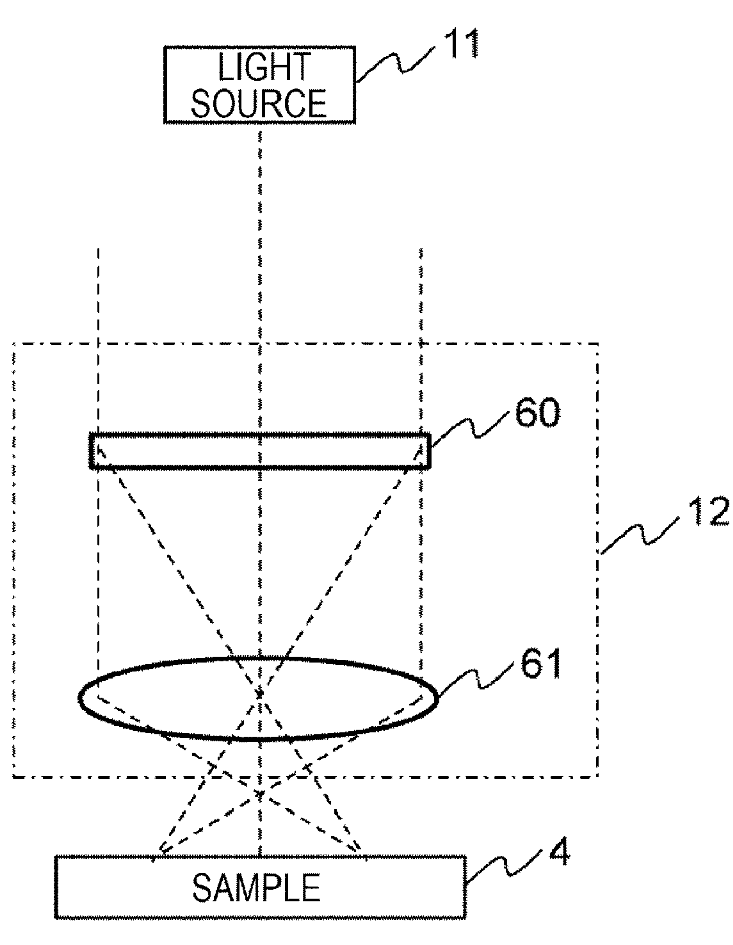
FIG. 4A is a configuration example of the pattern forming unit.

In a second example of the optical pattern formed by the pattern light, the excitation light from the light source 11 is transmitted through or reflected by an optical mask on which a pattern (referred to as a mask pattern) is formed, and the mask pattern is projected onto the sample 4. A transmissive mask or a reflective mask can be used as the optical mask, and the pattern forming unit 12 includes a projection optical system including a lens or a mirror such that the mask pattern of the optical mask forms an image on the sample 4. FIG. 4A shows a configuration example of the pattern forming unit 12 that projects a mask pattern formed on a transmissive mask 60 onto the sample 4 by the transmissive mask 60 and a projection lens 61.

Figure 4B:
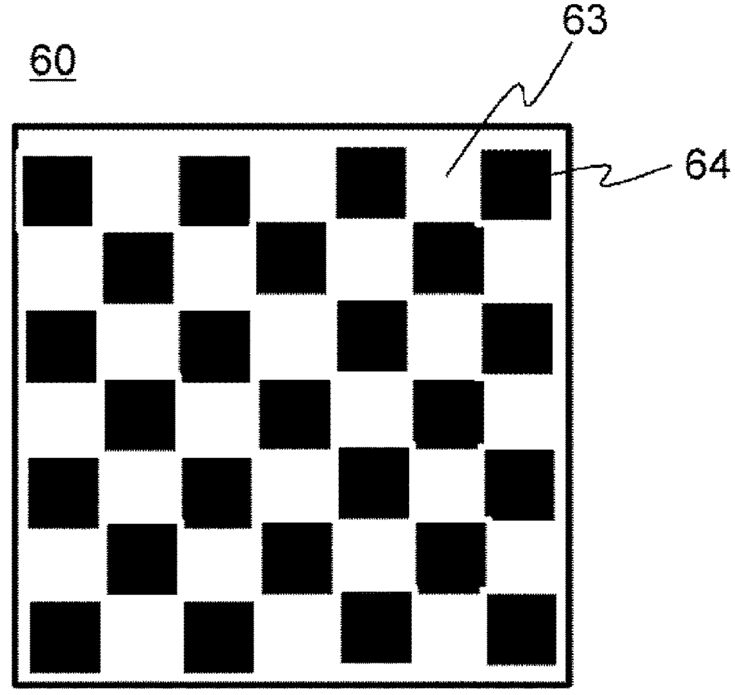
FIG. 4B is an example of a mask pattern.

FIG. 4B shows an example of a mask pattern formed on the transmissive mask 60 shown in FIG. 4A. A checkered pattern is formed by transmissive portions 63 that allow the excitation light to transmit therethrough and shielding portions 64 that shield the excitation light. Even when the reflective mask is used, it is possible to project the same mask pattern onto the sample 4 by providing a reflective portion and a transmissive portion in the same manner. Although a shape of the mask pattern is not limited, it is desirable to use a binary pattern including many line edges in order to adjust the electron optical system by using feature data of a bright and dark pattern formed by an optical pattern as described later.

When the pattern forming unit 12 is turned on, the optical mask is inserted into the optical path of the excitation light from the light source 11. When the pattern forming unit 12 is turned off, the optical mask may be moved outside the optical path of the excitation light, or a detour path for emitting the excitation light to the sample 4 from the light source 11 without passing through the optical mask may be provided in advance, and the optical path of the excitation light may be switched to the detour path.

Figure 5:
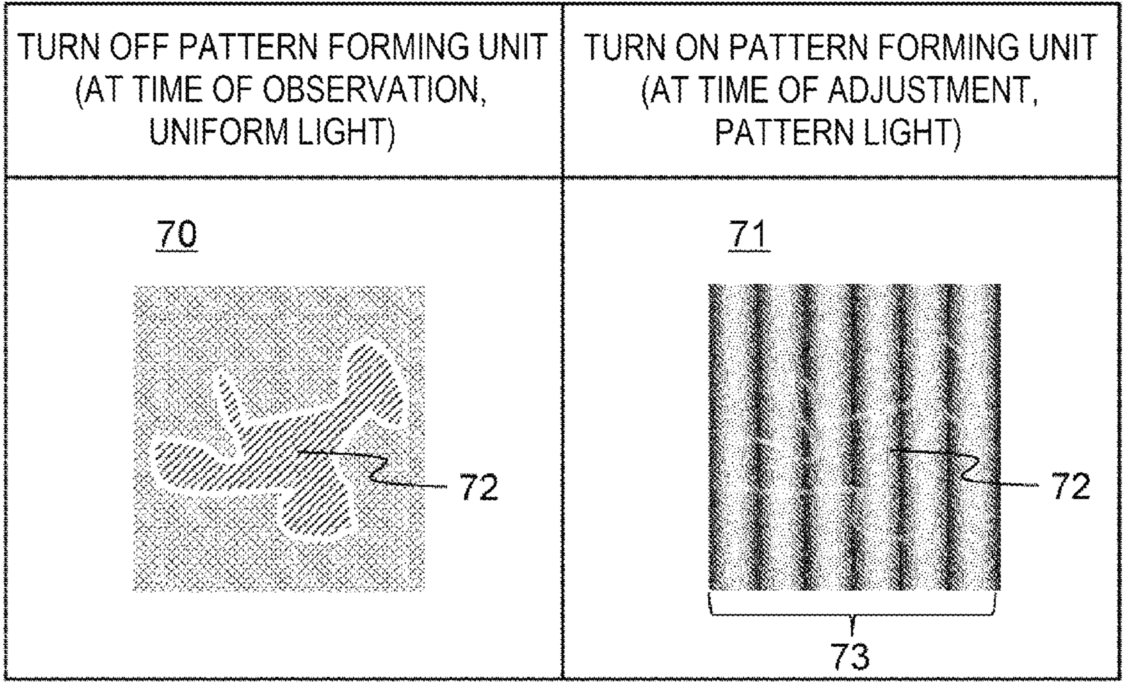
FIG. 5 is a diagram showing photoelectron images when the pattern forming unit is turned on and off.

Photoelectron images obtained when the pattern forming unit 12 is turned on and off will be described with reference to FIG. 5. A photoelectron image 70 is a photoelectron image when the pattern forming unit is turned off (at a time of observation). The optical system 1 is adjusted so that the sample 4 is uniformly irradiated with the excitation light from the light source 11 when the pattern forming unit 12 is turned off. When a region having a different material or structure in the sample 4 is present, an emission probability of photoelectrons generated by irradiation with the excitation light 5 is different between the region and another region. A difference in the emission probability of the photoelectrons becomes contrast of the photoelectron image, and the photoelectron image is obtained.

A region 72 in the photoelectron image 70 reflects a region having a different material or structure on the surface of the sample 4. A higher intensity of the excitation light for irradiation leads to a brighter photoelectron image. Therefore, when the intensity of the excitation light obtained when uniform light is emitted as the excitation light 5 is set to A, the emission probability of the photoelectrons on the sample surface is set to P(x, y), and luminance of the photoelectron image 70 is set to I1(x, y), I1(x, y)=A·P(x, y) can be expressed.

On the other hand, when the pattern forming unit 12 is turned on and the pattern light is emitted as the excitation light 5, the intensity of the excitation light differs depending on an irradiation position. Therefore, when the intensity of the excitation light is set to A(x, y) and luminance of a photoelectron image 71 is set to I2(x, y), I2(x, y)=A(x, y)·P(x, y) can be expressed.

Ideally, the intensity A(x, y) of the excitation light as the pattern light can have a maximum value of A (intensity of excitation light obtained when uniform light is emitted), and a minimum value of 0 (a state in which the excitation light is not emitted). Therefore, contrast of the bright and dark pattern formed by the optical pattern can be higher than contrast generated by the emission probability P(x, y) of the photoelectrons due to the material or structure of the sample. Therefore, regardless of the material and structure of the sample surface of the sample 4, a bright and dark pattern 73 formed by the optical pattern in the photoelectron image 71 can be easily observed and can be analyzed with high accuracy. By utilizing this fact, firstly, focus adjustment of the electron optical system 2 is performed based on sharpness of the bright and dark pattern 73 in the present embodiment. Since the bright and dark pattern formed by the optical pattern has high contrast, focus adjustment can be easily performed with high accuracy. Secondly, a magnification of the photoelectron image is calculated based on a dimension of the optical pattern on the sample and the bright and dark pattern 73 in the photoelectron image 71. Since the bright and dark pattern formed by the optical pattern has high contrast, the magnification of the photoelectron image can be easily calculated with high accuracy. The dimension of the optical pattern on the sample formed by the pattern light is obtained in advance and stored in the storage unit 21.

Figure 6:
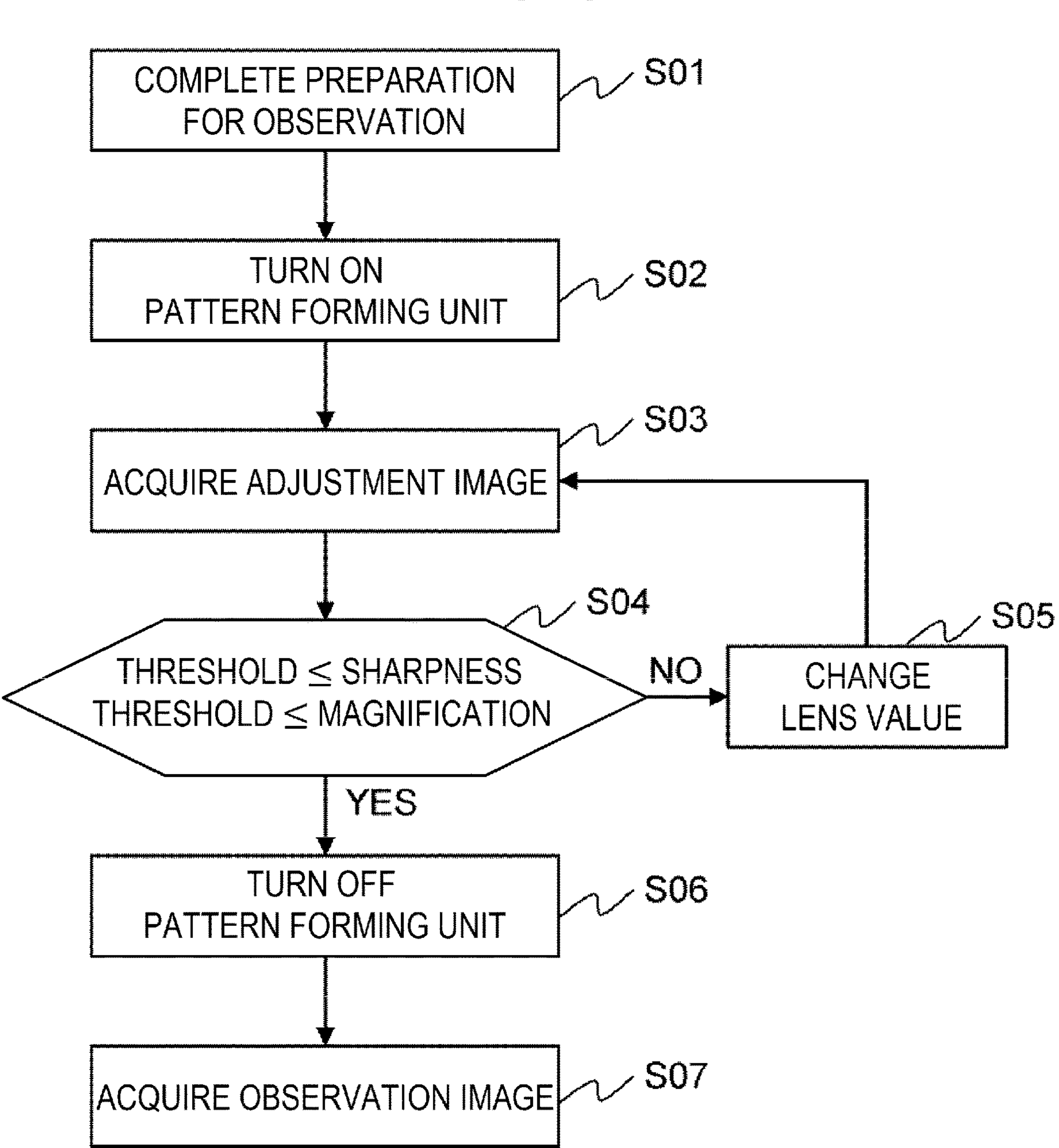
FIG. 6 is a flowchart of observation by the electron beam application apparatus.

FIG. 6 shows a flowchart of observation by the electron beam application apparatus. This flow is controlled by the control unit 20. First, preparation for observation is performed (S01). In a stage in which the preparation for observation is completed, a position of the sample surface to be observed may be captured in an observation field of view. Next, the control unit 20 turns on the pattern forming unit 12 (S02) and acquires an adjustment image (S03). The adjustment image is, for example, a photoelectron image such as the photoelectron image 71 (see FIG. 5). Sharpness and the magnification of the photoelectron image are calculated based on the bright and dark pattern of the adjustment image, and compared with a predetermined threshold (S04).

When the bright and dark pattern is, for example, line patterns such as the bright and dark pattern 73 of the photoelectron image 71, a luminance change at edges of the line patterns can be used as an index of the sharpness. For example, it can be determined that the sharpness is high when the luminance change at an edge portion is steep, and the sharpness is low when the luminance change at the edge portion is moderate. Further, by counting the number of the line patterns included in the adjustment image, the dimension of the optical pattern corresponding to the line patterns is known, so that an actual size of the region shown in the adjustment image can be calculated. The magnification can be calculated based on the actual size and a size of the adjustment image.

When the sharpness and the magnification of the adjustment image do not satisfy desired thresholds, a lens value of the electron optical system 2 is changed to perform magnification adjustment and focus adjustment (S05). When the sharpness and the magnification of the adjustment image satisfy the desired thresholds, the pattern forming unit is turned off (S06), and an observation image is acquired (S07). The observation image is, for example, a photoelectron image such as the photoelectron image 70 (see FIG. 5). By adjusting the electron optical system with the bright and dark pattern, a photoelectron image on the sample surface can be acquired as a clear photoelectron image at a desired magnification.

The PEEM is generally used for observation for the purpose of sample analysis, but it is considered that the PEEM can be used as an inspection apparatus of a pattern shape formed on a surface of a semiconductor wafer, in which an optical inspection apparatus using light and a scanning electron microscope (SEM) inspection apparatus using an electron beam are widely used at present. The present embodiment in which the electron optical system is adjusted at a high speed and with high accuracy using the bright and dark pattern formed by the optical pattern is extremely effective for the PEEM inspection apparatus.

Figure 7:
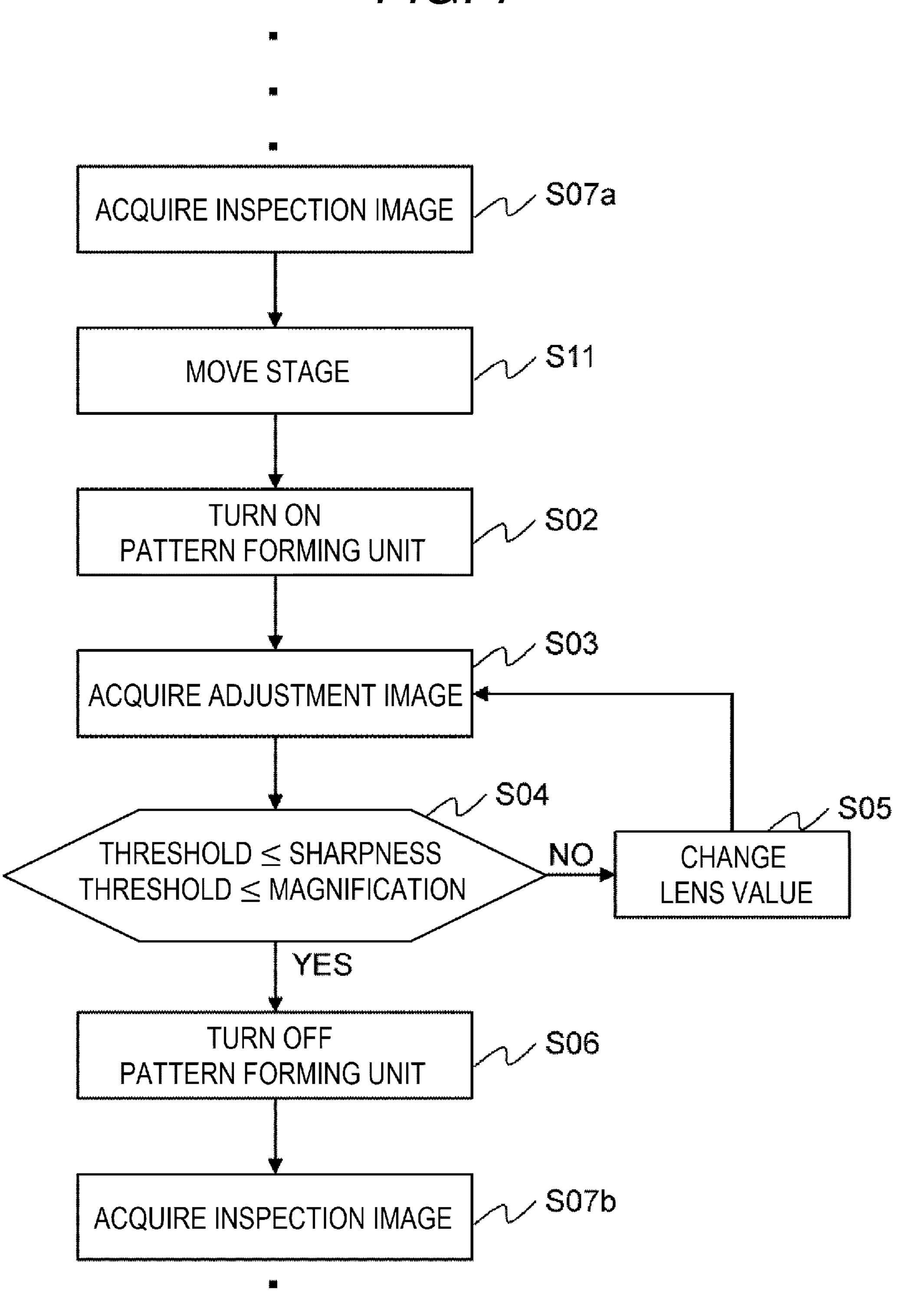
FIG. 7 is a flowchart of inspection by a PEEM inspection apparatus.

FIG. 7 shows a flowchart of inspection by the PEEM inspection apparatus. This flow is also controlled by the control unit 20. The same processing as those in the flowchart of FIG. 6 is denoted by the same reference numerals, and a redundant description thereof will be omitted. A plurality of inspection points are set on the semiconductor wafer, and the stage is moved to a next inspection point (S11) after an inspection image for a certain inspection point is acquired (S07*a*). The control unit 20 turns on the pattern forming unit 12 (S02) and acquires an adjustment image (S03). The sharpness and the magnification of the photoelectron image are calculated based on the bright and dark pattern of the adjustment image, and compared with the predetermined threshold (S04).

When the sharpness and the magnification of the adjustment image do not satisfy the desired thresholds, the lens value of the electron optical system 2 is changed to perform the magnification adjustment and the focus adjustment (S05). When the sharpness and the magnification of the adjustment image satisfy the desired thresholds, the pattern forming unit is turned off (S06), and the inspection image is acquired (S07*b*). Thereafter, the stage is moved to a next inspection point.

As described above, a magnification of the inspection image at the inspection point changes by performing the focus adjustment. In the step of changing the lens value (S05), the lens value may be adjusted so that the inspection image has a constant magnification. Alternatively, if the magnification is within a predetermined range, the lens value for matching the magnification of the inspection image at each inspection point may not be adjusted. As a result, throughput of inspection image acquisition can be improved. Instead of changing the lens value for magnification adjustment, the inspection image obtained by image processing may be enlarged or reduced based on the magnification, or quality determination in the inspection may be performed in consideration of the magnification of the inspection image without performing the image processing on the inspection image.

What is claimed is:

1. An electron beam application apparatus comprising:

an optical system configured to irradiate a sample with excitation light;

an electron optical system configured to project, onto a camera, a photoelectron image formed by photoelectrons emitted from the sample irradiated with the excitation light; and a control unit, wherein the optical system includes a light source configured to generate the excitation light and a pattern forming unit, the excitation light forms an optical pattern on a surface of the sample when the pattern forming unit is turned on, and the excitation light is emitted to the sample without forming the optical pattern on the surface of the sample when the pattern forming unit is turned off, the control unit adjusts the electron optical system based on a sharpness and a magnification of a bright and dark pattern formed by the optical pattern in the photoelectron image obtained by turning on the pattern forming unit, and the optical pattern is an interference fringe, and the interference fringe is generated by branching the excitation light from the light source into a plurality of pieces of excitation light having an optical path difference formed by the pattern forming unit and causing the plurality of pieces of excitation light to interfere with each other.

2. The electron beam application apparatus according to claim 1, wherein the control unit adjusts focus of the electron optical system such that the sharpness of the bright and dark pattern satisfies a predetermined threshold.

3. The electron beam application apparatus according to claim 1, wherein the control unit adjusts a magnification of the electron optical system such that the magnification of the photoelectron image satisfies a predetermined threshold.

4. The electron beam application apparatus according to claim 1, wherein the pattern forming unit includes an optical element having an optical plane, the optical element is inserted into an optical path of the excitation light when the pattern forming unit is turned on, and the optical element is disposed outside the optical path of the excitation light when the pattern forming unit is turned off.

5. The electron beam application apparatus according to claim 1, wherein the pattern forming unit includes an optical assembly configured to branch incident light into a plurality of optical paths, merge the light again, and emit the light, the optical assembly branches the excitation light into a plurality of optical paths, merges the light again, and emits the light when the pattern forming unit is turned on, and the optical assembly emits the excitation light as it is without branching the excitation light into the plurality of optical paths when the pattern forming unit is turned off.

6. The electron beam application apparatus according to claim 1, wherein the optical pattern is an interference fringe, and the interference fringe is generated by mutual interference between the excitation light and reflected light from a mirror by reflecting the reflected light of the excitation light reflected by the sample toward the sample by the mirror.

7. The electron beam application apparatus according to claim 6, wherein the mirror is disposed so as to reflect the reflected light from the sample toward the sample when the pattern forming unit is turned on, and the mirror is disposed outside an optical path of the reflected light from the sample when the pattern forming unit is turned off.

8. An electron beam application apparatus comprising:

an optical system configured to irradiate a sample with excitation light;

an electron optical system configured to project, onto a camera, a photoelectron image formed by photoelectrons emitted from the sample irradiated with the excitation light; and a control unit, wherein the optical system includes a light source configured to generate the excitation light and a pattern forming unit, the excitation light forms an optical pattern on a surface of the sample when the pattern forming unit is turned on, and the excitation light is emitted to the sample without forming the optical pattern on the surface of the sample when the pattern forming unit is turned off, the control unit adjusts the electron optical system based on a sharpness and a magnification of a bright and dark pattern formed by the optical pattern in the photoelectron image obtained by turning on the pattern forming unit, and the pattern forming unit includes an optical mask on which a mask pattern is formed and a projection optical system configured to project the mask pattern onto the sample, and the optical pattern is the mask pattern projected onto the surface of the sample.

9. The electron beam application apparatus according to claim 8, wherein the optical mask is disposed so as to transmit or reflect the excitation light when the pattern forming unit is turned on, and the optical mask is disposed outside an optical path of the excitation light or the optical path of the excitation light is diverted with respect to the optical mask when the pattern forming unit is turned off.

* * * * *